United States Patent
Hamberger et al.

(10) Patent No.: US 12,345,750 B2
(45) Date of Patent: Jul. 1, 2025

(54) METHOD AND RADIATION DETECTOR FOR AUTOMOTIVE RADAR TESTS

(71) Applicant: Rohde & Schwarz GmbH & Co. KG, Munich (DE)

(72) Inventors: Gerhard Hamberger, Munich (DE); Steffen Neidhardt, Munich (DE); Benedikt Simper, Munich (DE); Matthias Beer, Munich (DE); Maximilian Bogner, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 99 days.

(21) Appl. No.: 18/342,086

(22) Filed: Jun. 27, 2023

(65) Prior Publication Data

US 2025/0004026 A1 Jan. 2, 2025

(51) Int. Cl.
*G01R 27/32* (2006.01)
*G01R 29/08* (2006.01)

(52) U.S. Cl.
CPC ................... *G01R 29/0835* (2013.01)

(58) Field of Classification Search
CPC ....... G01R 29/0835; G01R 29/10; G01S 7/03; G01S 7/4052; G01S 7/4008; G01S 7/4082; G01S 7/4095
See application file for complete search history.

(56) References Cited

U.S. PATENT DOCUMENTS

| | | | | |
|---|---|---|---|---|
| 5,371,505 | A * | 12/1994 | Michaels | H01Q 1/42 324/639 |
| 11,899,098 | B2 * | 2/2024 | Mikhailov | G01S 7/40 |
| 2009/0102700 | A1 * | 4/2009 | Kato | G01S 7/4008 342/173 |
| 2018/0306903 | A1 * | 10/2018 | Heuel | G01S 7/40 |
| 2022/0091170 | A1 * | 3/2022 | Berry | G01S 7/4052 |
| 2022/0397661 | A1 * | 12/2022 | Vook | G01S 13/931 |
| 2023/0305107 | A1 * | 9/2023 | Hamberger | G01S 7/025 |
| 2024/0094339 | A1 * | 3/2024 | Himmler | G01S 7/40 |
| 2024/0241164 | A1 * | 7/2024 | Seok | G01R 23/15 |

FOREIGN PATENT DOCUMENTS

| | | |
|---|---|---|
| DE | 102018207864 A1 | 11/2019 |
| EP | 3392669 A1 | 10/2018 |

* cited by examiner

*Primary Examiner* — Thang X Le
(74) *Attorney, Agent, or Firm* — CHRISTENSEN O'CONNOR JOHNSON KINDNESS PLLC

(57) ABSTRACT

Embodiments of the present disclosure relate to a method of testing a radio frequency (RF) attenuation of a radar cover. A radiation detector is provided. The radiation detector is located with respect to a radar device and/or a radar cover at a distance. A reference value of radiated power is obtained. A radar signal radiated by the radar device is received by the radiation detector. A radiated power is determined based on the radar signal received. Information about the radio frequency attenuation of the radar cover is derived from the radiated power by using the reference value. Further, a radiation detector and a test system are described.

20 Claims, 2 Drawing Sheets

METHOD AND RADIATION DETECTOR FOR AUTOMOTIVE RADAR TESTS

FIELD OF THE DISCLOSURE

Embodiments of the present disclosure relate to a radiation detector and to a method for automotive radar tests, particularly in workshops and during annual inspection. Moreover, embodiments of the present disclosure relate to a test system.

BACKGROUND

Modern vehicles include advanced driver assistance systems (ADAS) relying on radar devices, also called radar sensors, which are typically located behind a radar transparent part (radar cover), for instance a bumper or a design radome. The radar device and the radar cover together form a radar system.

It is important to regularly check the functionality of the ADAS, for example for autonomous vehicles, also called self-driving vehicles. If a vehicle needs to visit a garage due to a crash or a scratch in the area of the radar device, the garage staff needs to find out whether the advanced driver assistance system is still functional or impaired.

Currently, the radar transparent part (radar cover) gets either replaced or an attempt is made to repair the damage. After a repair, for example a new coating for the bumper, it is a challenge to determine whether the functionality of the radar system was preserved in the process.

Known systems which can measure the attenuation of the radar cover, e.g. the bumper or the radome, have drawbacks including for example that the radar cover has to be unmounted. In addition, the known systems require increased radio frequency (RF) technology knowledge in order to evaluate the result obtained when performing the RF measurements. Obviously, such knowledge cannot be assumed for staff of a garage.

Further, there is no test system for the complete system including the radar device and the radar cover, namely the bumper/radome. Instead, a feedback loop from the radar device is required.

It is an object of the present disclosure to provide a method and a radiation detector for determining the functionality of a radar system, which is simple and for example user-friendly.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

The present disclosure provides a method of testing a radio frequency (RF) attenuation of a radar cover. In an embodiment, the method comprises the steps of: providing a radiation detector; locating the radiation detector with respect to a radar device and/or a radar cover at a distance; obtaining a reference value of radiated power; receiving, by the radiation detector, a radar signal radiated by the radar device, wherein the radar signal passes through the radar cover; determining a radiated power of the radar device on the basis of the received radar signal; and deriving information about the radio frequency attenuation of the radar cover from the radiated power by using the reference value.

The present disclosure further provides a radiation detector for testing a radio frequency (RF) attenuation. In an embodiment, the radiation detector comprises an electronic circuit. The radiation detector is positionable at a distance with respect to a radar cover and/or a radar device. The radiation detector is configured to receive at least one radar signal radiated by the radar device, wherein the radar signal passes through a radar cover. The radiation detector is further configured to determine a radiated power on the basis of the received radar signal. The radiation detector is further configured to derive information about the radio frequency attenuation of the radar cover from the radiated power by using a reference value of radiated power.

A main idea of the present disclosure is to provide a system and a method, which can be used to determine whether a repair of a part of the radar system, for instance a bumper and/or a radome, was successful insofar that the functionality of an advanced driver assistance system (ADAS) is not impaired due to the repairing, e.g. Automatic Cruise Control (ACC), blind spot detection, lane change assistant and similar systems. Moreover, it can be verified whether a replacement of the respective part is necessary with respect to the functionality of the advanced driver assistance system. For instance, it might be checked whether a scratch impairs the functionality of the advanced driver assistance system or not. Moreover, it can be checked whether a repair of the part, e.g. a (further) painting, impairs the functionality. An impairment of the functionality can be derived from the radio frequency attenuation.

Systems and methods according to the present disclosure also allow checking the functionality of the radar system, for example as part of end-of-line testing or regular inspections, e.g. annual inspections or mileage-dependent inspections.

The verification can be done for an assembled vehicle, namely a vehicle equipped with a radar system that includes the radar device and the radar cover. Accordingly, there is no need to disassemble the radar cover, e.g. the bumper, if a painting on the outer surface of the radar cover is renewed. The solution is cost effective and can be used without RF technology knowledge, as the result obtained may be categorized in two categories, for instance "fail" and "pass".

Further, the number of permissible paintings for the respective part of the vehicle, namely the radar cover, does not have to be restricted, as it can be determined by the garage whether the advanced driver assistance system still works. Of course, the respective verification can also be done during regular checks, e.g. annual vehicle inspections.

Moreover, it is ensured that the attenuation test of the radar cover can be performed based on real radar signals, namely the radar signals that would be radiated by the radar device of the vehicle. In other words, the present disclosure does not rely on a signal generator that generates an artificial signal corresponding to a real radar signal.

In some embodiments, the radar device may be the radar device implemented or to be implemented in the vehicle. However, the radar device may also relate to a separately formed radar device that works in the same frequency range as the one implemented or to be implemented. The radar device may work for example at 77 GHz (with a bandwidth of 5 GHZ), at 24 GHz (with a bandwidth of 200 MHz or 4 GHZ) or at 120 GHz (with a bandwidth of more than 20 GHz).

In some embodiments, the radar device is a radar device of a vehicle or a radar sensor of a vehicle. The vehicle can be, for example, an automotive vehicle, e.g. a car or a truck, a watercraft, e.g. a ship or a boat, or an aircraft, e.g. an airplane or an unmanned aerial vehicle.

In some embodiments, the radar device may be part of an advanced driver-assistance system (ADAS). As mentioned above, examples of an ADAS are adaptive cruise control (ACC), blind spot monitoring, lane centering, or lane change assistance.

In some embodiments, the reference value of radiated power may be a power solely radiated by the radar device or it may be a radiated power of a radar unit comprising the radar device and the radar cover, namely the radiated power of the radar device, which is attenuated by the radar cover when the radar signal passes the radar cover.

In other words, if the reference value is a radiated power of a radar unit comprising the radar device and the radar cover, the reference value particularly relates to the power originally radiated by the radar device and subsequently attenuated by the radar cover.

Generally, the reference value of radiated power may be measured (previously) or obtained theoretically.

Deriving information about the radio frequency attenuation of the radar cover may comprise, for example, comparing the (actually) radiated power Prad with the reference value of radiated power (Pref), e.g. a previously measured radiated power or a theoretical value. In particular, the following relation holds:

$$Prad > Pref - atol$$

Therein, atol is a suitable tolerance value. As an example, the tolerance value can be 2 dB. The tolerance value may however also be 0 dB, for example if system variation is already accounted for in the reference value of radiated power Pref.

In some embodiments, the reference value of the radiated power may be an equivalent isotropically radiated power (EIRP), for example a maximum EIRP or a mean EIRP. Which calculation method is optimal may depend on the operational characteristics of the radar device. For example, maximum EIRP may be particularly beneficial for frequency-modulated continuous wave (FMCW) radar, while mean EIRP may be more advantageous for pulse-based radar.

According to an aspect, the method may further comprise, for example, a step of determining at least one attenuation metric of the radar cover. The attenuation metric can be used as an indicator providing insight about a state of the radar cover. Actually, the attenuation metric determined can be compared with a pass threshold (provided by the vehicle's manufacturer) or a reference value provided on a datasheet of the radar cover. Thus, it can be determined whether the radar cover is functional or not in terms of radio frequency attenuation.

In some embodiments, the at least one attenuation metric of the radar cover may be frequency- and/or temperature-dependent. Valuable additional information about the attenuation properties of the radar cover can thus be provided. In particular, the power of the radar signal received by the radiation detector may be measured in a frequency-dependent way. Additionally or alternatively, an ambient parameter like the temperature may be varied during the power measurement for obtaining corresponding parameter-dependent measurement data (e.g. temperature-dependent power).

In some embodiments, the method may further comprise the step of comparing the determined attenuation metric of the radar cover with a threshold attenuation value. A quantification of a state of the radar cover can thus be provided and a compliance with predefined standards can be checked. In particular, the method also includes obtaining the threshold attenuation value.

In some embodiments, the threshold attenuation value may be for example larger than 1 dB, 2 dB or 2.5 dB. The threshold attenuation value may be smaller than 6 dB, 7 dB or 8 dB. As an example, the threshold attenuation value may be 5 or 3 dB.

If the reference value is a reference radiated power Pref of the radar device solely, then the following relation holds:

$$Prad > Pref - athr \quad (1)$$

Therein, Prad is the (actually) radiated power, Pref is the reference radiated power (i.e. the reference value) and athr is a threshold attenuation value of the radar cover. The threshold attenuation value may be a sum of a reference attenuation value aref and a corresponding suitable tolerance value atol:

$$athr = aref + atol$$

Moreover, an attenuation metric acalc of the radar cover can be determined, for example, by calculating the difference between the (actually) radiated power Prad and the reference radiated power Pref, e.g. a previously measured radiated power or a theoretical reference value:

$$acalc = Pref - Prad$$

With this definition for the attenuation metric acalc, relation (1) becomes:

$$athr > acalc$$

Hence, embodiments of the method may include checking if the determined attenuation metric acalc is smaller than the threshold attenuation value athr.

As an example, if the calculated radiated power is an equivalent isotropically radiated power (EIRP) the following relation holds:

$$EIRPcalc > EIRPref - aref - atol$$

Therein, EIRPcalc denotes the determined EIRP (e.g. a maximum EIRP), calculated on the basis of the radar signal received by the radiation detector, e.g. based on the measurement actually performed, EIRPref is a reference EIRP of the radar device, e.g. an obtained reference value of the EIRP (e.g. maximum EIRP) of the radar device. aref is the reference (radio frequency) attenuation value of the radar cover and atol is a suitable tolerance value. As an example, the tolerance value can be 2 dB. The tolerance value may also be 0 dB, particularly if system variation is already accounted for in the reference attenuation value.

In some embodiments, the attenuation values referred to herein are "one-way" attenuation values. "Two-way" attenuation values (considering that the radar wave passes through the radar cover two times) may be calculated from the "one way" values expressed in dB via multiplication by 2.

According to an aspect, the method may further comprise, for example, a step of outputting a result indicating if the radar cover has passed or failed an attenuation test during which the information about the radio frequency attenuation of the radar cover is determined. Thus, particularly accessible information about a state of the radar cover can be provided. The information is directly derivable or may be interpreted without specialized knowledge in RF technology.

In some embodiments, the result may be output on a graphical user interface (GUI) configured to visualize the result. In some embodiments, the visualization of the result can show also non-RF-professionals (besides RF-professionals) whether the radar cover passes or fails the respective test due to the RF attenuation determined, e.g. in words like "pass" or "fail", via traffic light symbols "red", "yellow" or "green", or similar. Additionally or alternatively, the result may be signaled by a dedicated sound for pass and fail, respectively, or it may be transmitted in a digital message, e.g. via an Ethernet connection.

According to another aspect, the method may further comprise, for example, a step of providing a signal guide between the radar device and the radiation detector. Providing the signal guide can help in locating the radar device and/or the radar cover at the distance with respect to the radiation detector. The signal guide may particularly relate to a spacer, i.e. a structure which ensures that the components of the system are arranged at end points of the signal guide such that the components have a distance relative to each other.

In some embodiments, the signal guide may be at least partly (electromagnetically) hollow so as to allow RF radiation to pass through the signal guide. The signal guide may for example have a tubular shape.

In some embodiments, the signal guide provides the advantage that a user may locate the radar device and/or radar cover relative to the radiation detector without having to perform a distance and/or orientation measurement. Further, the signal guide can ensure that an unforeseen change of the relative locations after the initial positioning can be immediately noticed and mitigated. The signal guide reduces the risk of errors and increases the reliability of the method.

Additionally or alternatively, a laser rangefinder or a conventional measurement tool like for example a measurement tape may be used to position the radar device and/or the radar cover at the distance. In case of a laser distance measurement, the measured distance may be fed back, in particular automatically, to the radiation detector.

In some embodiments, the signal guide may comprise an absorber structure. The absorber structure particularly includes a radiation-absorbent material for absorbing incident RF radiation. The absorber structure has the advantage that unwanted RF signals, for example arising from reflections, can be absorbed. Unwanted RF signals can thus be prevented from reaching the radiation detector such that the measurement accuracy can be improved.

In some embodiments, the absorber structure may be positioned on an inner wall of the signal guide. In particular, the signal guide may be an absorber tube, i.e. a tube including an absorber structure.

In some embodiments, the radiation detector is an RF radiation detector. The radiation detector may be a broadband radiation detector.

In some embodiments, the radiation detector may be configured for performing time-gated measurements, for example for performing time-gated spectrum analysis.

In some embodiments, the radar cover may be, for example, a radome or a bumper of a vehicle, e.g. a bumper with integrated radome.

In some embodiments, when the radar cover is in an assembled state, the relative position of the radar device and the radar cover is fixed. Accordingly, locating the radar device and the radar cover with respect to the radiation detector can be performed simultaneously. The radar cover being in an assembled state is particularly to be understood as the radar cover being mounted so as to cover the radar device.

In some embodiments, the radiation detector may be located at the distance with respect to a vehicle that is equipped with the radar device and the radar cover. Information about a state of the radar cover and for example the functionality the vehicle's ADAS can thus be obtained without having to disassemble the radar system.

In some embodiments, the reference value of radiated power (e.g. the maximum EIRP of the radar device) may be obtained for example from a storage medium, a datasheet or a specification of the radar device, e.g. manually input from the datasheet or the specification. The reference value may also be obtained from a database of the test provider or the radiation detector provider, e.g. from a storage medium of the radiation detector. Appropriate reference values power can be provided for example by a manufacturer of the vehicle comprising the radar device and the radar cover.

The advantage in this case is that a reference measurement is not required and hence the radar cover does not need to be disassembled. The method is thus particularly user-friendly as well as time and cost efficient.

In some embodiments, the radiation detector may be configured to obtain the reference value, e.g. the maximum EIRP, radiated by a radar device via an interface of the vehicle. The interface may be wired or wireless. The radiation detector may be connected to the automotive Ethernet of the vehicle for obtaining the reference value.

Additionally or alternatively, the reference value (e.g. radiated EIRP value) may be obtained by performing a reference measurement or normalization measurement without the radar cover. The reference measurement may relate to a free-space (power) measurement.

In some embodiments, a typical value for the maximum radiated EIRP may be at least 10 or 20 dBm. The value may be at most 30, 55, or 60 dBm. As an example, the value may be 25 dBm.

According to an aspect, the radar cover may be, for example, a repaired radar cover, wherein the radio frequency attenuation of the radar cover is determined after the radar cover was repaired. Repairing the radio cover particularly includes a respective (re-)painting and/or coating of the radio cover. Hence, it is verified whether the repairing has any influence on the RF attenuation of the radar cover.

In some embodiments, the radiated power (e.g. maximum EIRP) may be calculated based on a receiving power measured by the radiation detector and a free-space path loss that depends on the distance.

In some embodiments, the measured power, i.e. receiving power, can be frequency- and/or temperature-dependent, because the attenuation properties of the radar cover may be dependent on those parameters. Hence, also the calculated radiated power may be frequency- and/or temperature-dependent. The calculation particularly further takes into account a conversion gain of a receiver chip of the radiation detector.

In some embodiments, the following relation holds:

$$Pcalc = Pmeas - gconv + FSPL.$$

As above, Pcalc denotes the (calculated) radiated power (e.g. maximum EIRP of the radiation detector), calculated on the basis of the received radar signal. Pmeas is the received power as measured by the radiation detector, for example in a frequency-dependent way. gconv is the conversion gain of the receiver chip of the radiation detector and particularly includes all losses on the receiver chain to the receiver chip. FSPL is the free-space path loss that depends on the distance between the radiation detector and the radar device that radiates the radar signal, wherein in particular the following relation holds:

$$FSPL = 20 \log 10 (4\pi d / \lambda).$$

Therein, d is the distance between the radar device and the radiation detector, for example antennas of the radar device and the radiation detector, and A is the wavelength of the radar signal.

As an example, a signal frequency of 76.5 GHz at a distance of 0.5 m results in FSPL=64.1 dB. At a distance of 0.55 m, the result is FSPL=64.9 dB. Accordingly, a measurement uncertainty may be 0.8 dB, when assuming a distance uncertainty of 5 cm at a targeted distance of 50 cm. The targeted distance may particularly be equal to the length of a signal guide as described herein. The mentioned distance uncertainty may stem at least partly from an unknown position of the radar device, for example its sensor. However, the position may be known and may thus be taken into account in the definition of the distance. In this case, the corresponding measurement uncertainty disappears.

The (calculated) radiated power, e.g. EIRP, determined from a radiation measurement where the radar cover was in an assembled state can be understood as a (calculated) radiated power, e.g. EIRP, of a complete radar unit including the radar device and the radar cover.

For example, the radiation detector may be configured for determining an attenuation of a frequency-varying signal.

In some embodiments, the radar device may be part of an advanced driver-assistance system (ADAS).

In some embodiments, the radiation detector includes a receiving antenna. The radiation detector may be a broadband radiation detector.

In some embodiments, the radar cover may be, for example, a radome or a bumper of a vehicle.

According to an aspect, a test system is provided. In some embodiments, the test system comprises a radiation detector as described herein and further comprises a signal guide.

In some embodiments, the signal guide may have a length larger than for example 15, 20, or 30 cm. The length may be smaller than for example 70, 80 or 85 cm. As an example, the signal guide may have a length of 50 cm.

According to an aspect, the radiation detector may further comprise, for example, a storage medium including calibration data of the radiation detector. In particular, the calibration data is attained during manufacturing of the radiation detector.

In some embodiments, the calibration data may be frequency-resolved. Frequency-resolved calibration data is particularly beneficial if the radar device uses only a limited portion of a radar bandwidth. As an example, the radar bandwidth may be 5 GHz.

According to an aspect, the calibration data may include, for example, calibration data for each polarization, e.g. horizontal polarization and/or vertical polarization.

In some embodiments, the calibration data may include calibration data for different temperatures.

In some embodiments, the radiation detector may comprise a graphical user interface (GUI) configured to visualize a result indicating if the radar cover has passed or failed an attenuation test during which the information about the radio frequency attenuation of the radar cover is determined. RF technology knowledge is not required due to the GUI that provides the result in an intuitive manner, as the result obtained may be categorized in two categories, for instance "fail" and "pass", which is provided by the GUI.

In some embodiments, the radiation detector may be used in systems and methods according to the present disclosure. Features and advantages described with regard to the radiation detector and the test system apply analogously to methods according to the present disclosure and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
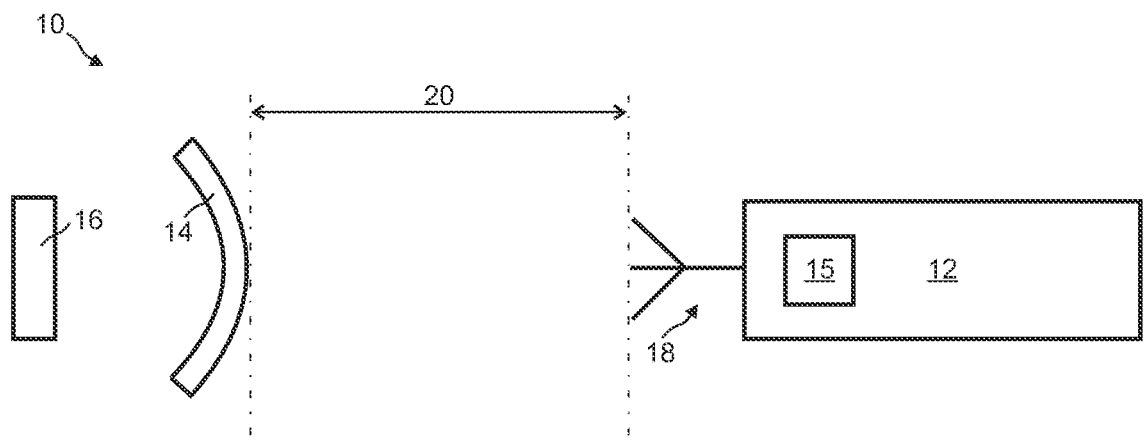
FIG. 1 schematically shows a test arrangement with a radiation detector according to an embodiment of the present disclosure, FIG. 2 schematically shows a test arrangement with a radiation detector according to another embodiment of the present disclosure, FIG. 3 schematically shows a radiation detector according to a further embodiment of the present disclosure.

FIG. 1 schematically shows an example of a test arrangement 10 with a radiation detector 12 according to a first embodiment of the present disclosure. The test arrangement 10 comprises the radiation detector 12, a radar cover 14, and a radar device 16 that is configured to radiate a radar signal.

The radiation detector 12 includes a receiving antenna 18 for receiving a radar signal, namely the radar signal radiated by the radar device 16. The radiation detector 12 is located at a distance 20 with respect to the radar cover 14 and/or the radar device 16. In the shown embodiment, the radiation detector 12 is located at the distance 20 with respect to the radar cover 14.

The radar cover 14 may be in an assembled state such that the radar detector 12 is also located at a distance 20 with respect to the radar device 16. The radar cover 14 being in an assembled state is to be understood as the radar cover 14 being mounted so as to cover the radar device 16. Therefore, a fixed relation between the radar cover 14 and the radar device 16 is provided. In other words, a movement of the radar cover 14 relative to the radar device 16 is not possible in the assembled state.

The radar device 16 is configured to radiate at least one radar signal that passes the radar cover 14. This means that the at least one radar signal runs through the radar cover 14. In other words, the radar cover 14 is exposed to the at least one radar signal. The radiation detector 12 is configured to receive the at least one radar signal radiated by the radar device 16.

The radar device 16 may require a certain amount of time, e.g. between 1 and 3 seconds, to radiate at its maximum power. This is taken into account when measuring the radar signal by the radiation detector 12.

The radiation detector 12 is further configured to determine a radiated power, for instance a calculated radiated power like a maximum EIRP, on the basis of the radar signal received at the distance 20. The radiation detector 12 is further configured to compare the (calculated) radiated power, e.g. (an actually determined) maximum EIRP, with a reference value of radiated power, e.g. a (theoretical or previously determined) maximum EIRP of the radar device 16, in order to determine information about the radio frequency attenuation of the radar cover 14.

The reference value of the radiated power, e.g. maximum EIRP of the radar device 16, may be obtained by performing a reference measurement without any radar cover 14 located between the radiation detector 12 and the radiation detector 12, e.g. after disassembling the radar cover 14. The respective reference measurement may relate to a normalization. The reference measurement can be performed for the radar device 16, e.g. the radar device 16 implemented in a vehicle, or a similar radar device having the same characteristics, for instance a spare part.

Alternatively, the reference value of the radiated power, e.g. maximum EIRP of the radar device 16, may be obtained differently, for instance from a specification or a datasheet.

Hence, the effect of the radar cover 14 can be determined, for example its transmission attenuation.

In some embodiments, the radiation detector 12 may comprise a memory, such as storage medium 15, that includes data/information stored that relate to the reference value of the radiated power, e.g. maximum EIRP of the radar device 16. In some embodiments, the calibration data of the radiation detector 12 may be stored on the storage medium 15. The calibration data may be frequency-resolved. The calibration data particularly includes calibration data for each polarization, e.g. a horizontal polarization and/or a vertical polarization.

Generally, the reference value of the radiated power may relate to an equivalent isotropically radiated power (EIRP), for example a maximum EIRP or a mean EIRP. The respective type of reference value used may depend on the characteristics of the radar device 16. For example, maximum EIRP may be particularly beneficial for frequency-modulated continuous wave (FMCW) radar, while mean EIRP may be more advantageous for pulse-based radar.

Figure 2:
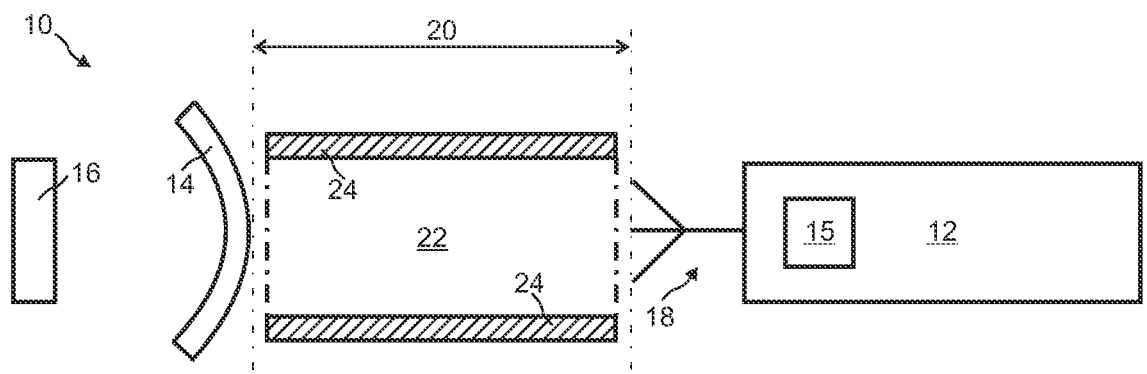

FIG. 2 schematically shows a test arrangement 10 with a radiation detector 12 according to a second embodiment of the present disclosure. Only differences with respect to the test arrangement shown in FIG. 1 are described hereinafter in more detail.

The test arrangement 10 further comprises a signal guide 22 that may have a length between 20 and 80 cm. The signal guide 22 is a component of a test system comprising the radiation detector 12 and the signal guide 22.

The signal guide 22 may comprise an absorber structure 24. The absorber structure 24 may be positioned on an inner wall of the signal guide 22. The absorber structure 24 particularly includes a radiation-absorbent material for absorbing incident RF radiation. The absorber structure 22 absorbs unwanted RF signals, for example arising from reflections. Unwanted RF signals from the environment can thus be prevented from reaching the radiation detector 12 such that the measurement accuracy can be improved. In some embodiments, the signal guide 22 may be an absorber tube, i.e. a tube including an absorber structure 24.

Figure 3:
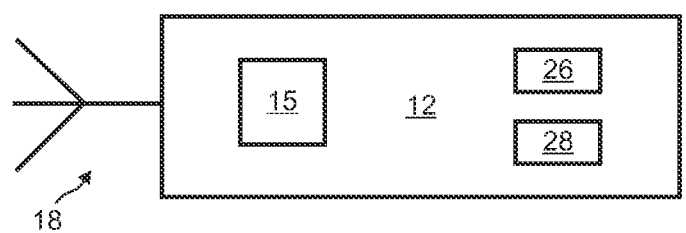

FIG. 3 schematically shows a certain embodiment of the radiation detector 12 for testing the radio frequency (RF) attenuation of the radar cover 14. The radiation detector 12 as shown in FIG. 3 may be also used in the test arrangement 10 shown in FIGS. 1 and 2.

In some embodiments, the radiation detector 12 may comprise or be a power meter, a receiver, a spectrum analyzer, a vector network analyzer, or similar. In some embodiments, the radiation detector 12 has a "max hold" measurement feature for determining a maximum power.

In some embodiments, the radiation detector 12 comprises an electronic circuit 26 and a graphical user interface (GUI) 28. The electronic circuit 26 may be a processing circuit. The receiving antenna 18 is connected with the electronic circuit 26 such that the radar signal received via the receiving antenna 18 is converted into an electrical signal by the receiving antenna 18, which is forwarded to the electronic circuit 26 for evaluating. The electronic circuit 26 may be part of the power meter, the receiver, the spectrum analyzer or the vector network analyzer.

Therefore, the radiation detector 12 is configured to receive the radar signal radiated by the radar device 16 shown in FIGS. 1 and 2. As discussed above, the radar signal radiated by the radar device 16 passes the radar cover 14. In other words, it propagates through the radar cover 14.

When evaluating the radar signal, for example the electrical signal derived from the radar signal received, the radiation detector 12 is configured to determine a (calculated) radiated power, e.g. maximum equivalent isotropically radiated power (EIRP), based on the radar signal received at the distance 20.

In some embodiments, the determination is performed by the electronic circuit 26 of the radiation detector 12.

As already discussed above, the radiation detector 12 is also configured for obtaining a reference value of the radiated power, e.g. a maximum EIRP of the radar device 16. The reference value of radiated power may be obtained for example from the storage medium 15, a datasheet or a specification of the radar device 16. Hence, the reference value of the radiated power, e.g. the maximum EIRP of the radar device 16, may be obtained in a theoretical manner, namely by referring to the datasheet or the specification. Moreover, the respective value may be stored, for instance during a calibration of the radar device 16, which has been performed after its manufacturing.

Alternatively, the reference value of the radiated power, e.g. the maximum EIRP of the radar device 16, may be obtained by performing a reference measurement, namely without the radar cover 14 being interposed between the radar device 16 and the radiation detector 12.

The radiation detector 12 is configured to compare the (calculated) radiated power, e.g. the calculated maximum EIRP, namely the value obtained with the radar cover 14 interposed, with the reference value of the radiated power, e.g. the maximum EIRP of the radar device 16, in order to determine the radio frequency attenuation of the radar cover 14. Actually, it is compared how much the calculated radiated power (based on the radar signal received) deviates from the reference value of the radiated power (e.g. the maximum EIRP of the radar device 16), thereby obtaining information about the radio frequency (RF) attenuation. In particular, the comparison is performed by the electronic circuit 26 of the radiation detector 12.

The GUI 28 is connected with the electronic circuit 26. Hence, the GUI 28 is enabled to receive evaluation data of the electronic circuit 26, which was determined when evaluating the radar signal received.

The GUI 28 is further configured to visualize a result based on the evaluation data, wherein the result indicates if the radar cover 14 has passed or failed an attenuation test during which information about the radio frequency attenuation of the radar cover 14 is derived. This may be done in a visual manner, for instance by displaying a text or by displaying a certain color like "red" or "green".

Alternatively to the GUI 28, an output interface may be provided, for instance at an optical output interface like least one light source, e.g. a red light-emitting diode (LED) and a green LED. The at least one light source is controlled by the electronic circuit 26, for example based on the evaluation data.

Additionally or alternatively, the output interface may be configured to provide acoustic or tactile (e.g. vibrational) feedback.

Figure 4:
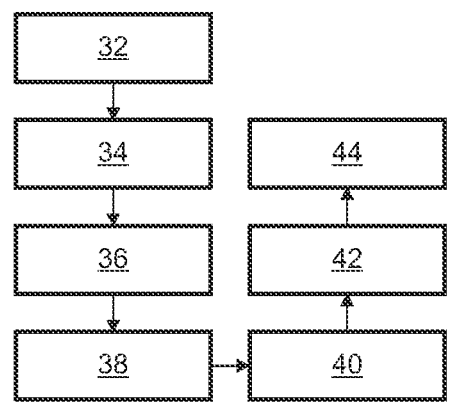
FIG. 4 is a flow chart illustrating a method according to an embodiment of the present disclosure.

FIG. 4 is a flow chart illustrating a method of testing a radio frequency (RF) attenuation of a radar cover 14. For example, the attenuation of a frequency-varying signal may be tested. In particular, the method may be performed by the radiation detector 12 described above with regard to FIGS. 1 and 2.

The method comprises the step 32 of providing the radiation detector 12, for instance the one shown in FIG. 3, a radar cover 14 and a radar device 16 configured to radiate radar signals. The radar device 16 is particularly a radar device of the vehicle or a radar sensor of the vehicle. The radar device 16 may be part of an advanced driver-assistance system (ADAS).

The method further comprises the step 34 of locating the radar device 16 and/or the radar cover 14 at a distance with respect to the radiation detector 12. As discussed above with respect to FIG. 1, the radar cover 14 may be located at the distance 20 which causes a defined distance of the radar device 16 with respect to the radiation detector 12 in case the radar cover 14 is provided in the assembled state.

Optionally, the method may comprise a step of providing a signal guide 22 between the radar device 16 and the radiation detector 12 (e.g. as shown in FIG. 2). The signal guide 22 may particularly be a spacer, i.e. a structure ensuring that objects arranged at end points of the structure have the distance 20 relative to each other.

The method further comprises the step 36 of obtaining a reference value of radiated power, e.g. a maximum equivalent isotropic radiated power (EIRP) radiated by the radar device 16.

In some embodiments, the radiation detector 12 may be configured to obtain the reference value (e.g. the maximum EIRP radiated by the radar device 16) via an interface of the vehicle. The interface may be wired or wireless. The radiation detector 12 may be connected to the automotive Ethernet of the vehicle for obtaining the value. Alternatively, the reference value of radiated power may be obtained from a datasheet or a specification of the radar device 16. In a further alternative, the reference value (e.g. maximum EIRP of the radar device 16) may be gathered by performing a reference measurement.

The method further comprises the step 38 of receiving, by the radiation detector 12, a radar signal radiated by the radar device 16, wherein the radar signal passes the radar cover 14.

The method further comprises the step 40 of determining a calculated radiated power (e.g. maximum EIRP) based on the radar signal received at the distance 20. The calculated radiated power (e.g. maximum EIRP) may be calculated based on a receiving power measured by the radiation detector 12 and a free-space path loss that depends on the distance 20. The calculation particularly further takes into account a conversion gain of a receiver chip of the radiation detector 12:

$$EIRPcalc = Pmeas - gconv + FSPL.$$

Pcalc denotes the calculated radiated power (e.g. maximum EIRP of the radiation detector 12), for instance a theoretical value obtained, Pmeas is the received power as measured by the radiation detector 12, gconv is the conversion gain of the receiver chip of the radiation detector 12 and includes all losses on the receiver chain to the receiver chip. FSPL is the free-space path loss that depends on the distance between the radiation detector 12 and the radar device 16 that radiates the radar signal, wherein in particular the following relation holds:

$$FSPL = 20\log10(4\pi d/\lambda).$$

Therein, d is the distance between the radar device 16 and the radiation detector 12, for example antennas of the radar device 16 and the radiation detector 12, and $\lambda$ is the wavelength of the radar signal.

The method further comprises the step 42 of deriving information about the radio frequency attenuation of the radar cover 14 from the (calculated) radiated power by using the reference value of radiated power.

Further, the method may further comprise a step of determining at least one attenuation metric of the radar cover 14. Hence, a metric (indicator value) is gathered that can be used for comparison purposes.

The method may further comprise the step 44 of comparing the determined attenuation metric of the radar cover 14 with a threshold attenuation value. The threshold attenuation value may be for example larger than 1 dB, 2 dB or 2.5 dB. The threshold attenuation value may be smaller than 6 dB, 7 dB or 8 dB. As an example, the threshold attenuation value may be 5 or 3 dB.

The method may further comprise a step of outputting a result indicating if the radar cover 14 has passed or failed an attenuation test during which the information about the radio frequency attenuation of the radar cover 14 is determined.

The result may be output on a graphical user interface (GUI) configured to visualize the result, for example the GUI 28 of the radiation detector 12 shown in FIG. 3. In particular, the visualization of the result can show non-RF-professionals whether it is a pass or fail, e.g. in words, via traffic light symbols, or similar. Of course, RF-professionals also obtain an intuitive feedback.

When performing the measurement for obtaining the measured power Pmeas, a maximum hold measurement may be performed in order to ensure detecting the maximum power. From the detected maximum power, for example a maximum EIRP may be calculated.

Generally, the respective attenuation test of the radar cover 14 may be performed on the vehicle that is equipped with the radar cover 14 and the radar device 16. In other words, the radar cover 14 may be a bumper of the vehicle or a radome of the vehicle. Actually, the radar cover 14 may be integrated within the bumper of the vehicle, which comprises further portions in addition to the radar cover 14. Hence, the radar device 16 is the onboard vehicle radar device. Consequently, the radiation detector 12 is located at the distance 20 with respect to the vehicle that is equipped with the radar device 16 and the radar cover 14.

Accordingly, it is not necessary to disassemble the radar cover 14 for testing its attenuation. In some embodiments, the radar characteristics of the radar device 16 of the vehicle can be used, which is characterized. Hence, the respective information/data about the radar device 16 of the vehicle is known, namely from the datasheet, the specification or a storage medium (e.g. of the radar device 16 or of the radiation detector 12), which can be read out. Alternatively, a spare part of the radar device 16 of the vehicle may be tested solely in order to obtain a reference value of radiated power for the vehicle, e.g. a value of a maximum equivalent isotropically radiated power (EIRP) of the radar device 16.

In general, the radar cover 14 can be a repaired radar cover, e.g. a (re-)painted or fixed radar cover (after an accident). Hence, the radio frequency attenuation of the radar cover 14 is tested after the radar cover was repaired in order to evaluate whether the entire radar system (of the vehicle), including the radar cover 14 and the radar device 16, still operates in the desired manner. Put differently, it can be evaluated whether the repairing of the radar cover 14 has any impact on the functionality.

After reworking the radar cover 14, e.g. with a new coating, the radiation detector 12 can be utilized for determining the calculated radiated power (e.g. EIRP) of the complete radar system, namely the radar device 16 and the radar cover 14, e.g. in the assembled state.

If the calculated radiated power (e.g. calculated EIRP) is lower than the reference value of radiated power (e.g. reference EIRP) of the radar device 16 (particularly minus an expected radio frequency attenuation of the radar cover 14 and a suitable confidence interval), it is in a first step assumed that the radar cover 14 has a higher radio frequency attenuation.

Hence, the radar cover 14 can be unmounted while performing the attenuation measurement again, just with the radar device 16. If the calculated radiated power (e.g. calculated maximum EIRP) of the radar device 16 now fits the reference value of radiated power (e.g. reference EIRP) of the radar device 16, e.g. the one from the datasheet or the specification, it can be verified that the deviation results from the reworked radar cover 14. If however the calculated radiated power (e.g. maximum EIRP) of the radar device 16 is too low, it can be determined that the radar device 16 itself needs to be replaced.

Certain embodiments disclosed herein include components, such as for example the radiation detector 12, the radar device 16, the electronic circuit 26, the graphical user interface (GUI) 28, etc., utilize circuitry (e.g., one or more circuits) in order to implement protocols, methodologies or technologies disclosed herein, operably couple two or more components, generate information, process information, analyze information, store information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry." "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

In some embodiments, one or more of the components referenced above include circuitry programmed to carry out one or more steps of any of the methods disclosed herein. In some embodiments, one or more computer-readable media associated with or accessible by such circuitry (e.g., processor, microprocessor, etc.) contains computer readable instructions embodied thereon that, when executed by such circuitry, cause the component or circuitry to perform one or more steps of any of the methods disclosed herein. In that regard, the circuitry and/or memory storing the program instructions forms a special purpose circuit or component specifically configured to carry out the methodologies and technologies described herein.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this document, the same or similar elements may bear the same references. Furthermore, the presence of reference numbers or letters in the drawings cannot be considered limiting, even when such numbers or letters are indicated in the claims.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of testing a radio frequency attenuation of a radar cover, the method comprising the steps of:
   providing a radiation detector;
   locating the radiation detector with respect to a radar device and/or the radar cover at a distance;
   obtaining a reference value of radiated power;
   receiving, by the radiation detector, a radar signal radiated by the radar device, wherein the radar signal passes through the radar cover;
   determining a radiated power on the basis of the received radar signal, wherein the radiated power is calculated based on a receiving power measured by the radiation detector, calibration data of the radiation detector, and a free-space path loss that depends on the distance; and
   deriving information about the radio frequency attenuation of the radar cover from the radiated power determined by using the reference value.

2. The method according to claim 1, further comprising the step of determining at least one attenuation metric of the radar cover.

3. The method according to claim 2, further comprising the step of comparing the determined attenuation metric of the radar cover with a threshold attenuation value.

4. The method according to claim 3, wherein the threshold attenuation value is 5 dB.

5. The method according to claim 1, further comprising the step of outputting a result indicating if the radar cover has passed or failed an attenuation test during which the information about the radio frequency attenuation of the radar cover is derived.

6. The method according to claim 5, wherein the result is output on a graphical user interface (GUI) configured to visualize the result.

7. The method according to claim 1, further comprising the step of providing a signal guide between the radar device and the radiation detector.

8. The method according to claim 7, wherein the signal guide comprises an absorber structure.

9. The method according to claim 1, wherein the radar cover is a radome or a bumper.

10. The method according to claim 1, wherein the radiation detector is located at the distance with respect to a vehicle that is equipped with the radar device and the radar cover.

11. The method according to claim 1, wherein the reference value is obtained from a storage medium, a datasheet or a specification of the radar device.

12. The method according to claim 1, wherein the radar cover is a repaired radar cover, and wherein the radio frequency attenuation of the radar cover is tested after the radar cover was repaired.

13. A radiation detector for testing a radio frequency attenuation, the radiation detector comprising an electronic circuit, wherein the radiation detector is positionable at a distance with respect to a radar cover and/or a radar device; wherein the radiation detector is configured to:
   receive at least one radar signal radiated by the radar device, wherein the radar signal passes through the radar cover,
   determine a radiated power on the basis of the received radar signal, wherein the radiated power is calculated based on a receiving power measured by the radiation detector, calibration data of the radiation detector, and a free-space path loss that depends on the distance, and
   derive information about the radio frequency attenuation of the radar cover from the radiated power by using a reference value of radiated power.

14. The radiation detector according to claim 13, wherein the radiation detector comprises a storage medium including calibration data of the radiation detector.

15. The radiation detector according to claim 14, wherein the calibration data is frequency-resolved.

16. The radiation detector according to claim 14, wherein the calibration data includes calibration data for each polarization.

17. The radiation detector according to claim 13, further comprising a graphical user interface configured to visualize a result indicating if the radar cover has passed or failed an attenuation test during which the information about the radio frequency attenuation of the radar cover is derived.

18. A test system comprising a radiation detector according to claim 13 and further comprising a signal guide.

19. The test system according to claim 18, wherein the signal guide has a length between 20 and 80 cm.

20. A method of testing a radio frequency attenuation of a radar cover, the method comprising:
   providing a radiation detector and a radar device;
   locating the radiation detector with respect to the radar device and/or the radar cover at a distance;

providing a signal guide between the radar device and the radiation detector, wherein the signal guide comprises an absorber structure;

obtaining a reference value of radiated power;

receiving, by the radiation detector, a radar signal radiated by the radar device, wherein the radar signal passes through the radar cover;

determining a radiated power on the basis of the received radar signal; and deriving information about the radio frequency attenuation of the radar cover from the radiated power determined by using the reference value.

\* \* \* \* \*